(12) United States Patent
Kawazu et al.

(10) Patent No.: US 6,410,131 B1
(45) Date of Patent: Jun. 25, 2002

(54) FLEXIBLE LUSTERED PRODUCTS

(75) Inventors: Kenji Kawazu, Aichi-ken; Sonoko Nishimoto, Toyota; Yukitaka Hasegawa, Inazawa; Yasuhiko Ogisu, Nagoya, all of (JP)

(73) Assignees: Toyoda Gosei Co., Ltd., Aichi-ken; Toyoda Jidosha Kabushiki Kaisha, Tokyo, both of (JP)

( * ) Notice: Subject to any disclaimer, the term of this patent is extended or adjusted under 35 U.S.C. 154(b) by 0 days.

(21) Appl. No.: 09/080,291

(22) Filed: May 18, 1998

(30) Foreign Application Priority Data

| | | |
|---|---|---|
| May 19, 1997 | (JP) | 9-128883 |
| May 19, 1997 | (JP) | 9-128884 |
| Apr. 27, 1998 | (JP) | 10-117120 |

(51) Int. Cl.[7] .............................................. B32B 15/08
(52) U.S. Cl. ...................... 428/336; 428/31; 428/424.2; 428/424.4; 428/424.8; 428/425.8; 428/425.9; 428/450
(58) Field of Search ................................ 428/215, 216, 428/335, 336, 424.2, 424.8, 425.8, 424.4, 425.9, 450, 31

(56) References Cited

U.S. PATENT DOCUMENTS

| 4,101,698 A | * | 7/1978 | Dunning et al. ............... 428/31 |
| 4,369,225 A | * | 1/1983 | Manabe ....................... 428/334 |
| 4,407,871 A | * | 10/1983 | Eisfeller ....................... 428/31 |
| 4,431,711 A | * | 2/1984 | Eisfeller ....................... 428/31 |
| 4,713,143 A | * | 12/1987 | Eisfeller ....................... 156/655 |
| 4,931,366 A | * | 6/1990 | Mullaney, Jr. ............... 428/622 |
| 4,935,275 A | * | 6/1990 | Ushida et al. ................. 428/31 |
| 5,624,759 A | * | 4/1997 | Usifer et al. ............. 428/424.2 |

FOREIGN PATENT DOCUMENTS

| EP | 0 751 235 | 1/1997 |
| JP | 57-12637 | 1/1982 |
| JP | 2-286328 | 11/1990 |
| JP | 7-323260 | 12/1995 |
| JP | 9-70920 | * 3/1997 |
| JP | 9-74273 | 3/1997 |

OTHER PUBLICATIONS

WPIDS on STN. Derwent Information Ltd. accessed on Jul. 26, 1999 JP 07–6624 A, Jan. 10, 1995.
WPIDS on STN. Derwent Information Ltd., accessed on Jul 26, 1999. JP 01–268777A, Oct. 16, 1989.

* cited by examiner

*Primary Examiner*—D. S. Nakarani
(74) *Attorney, Agent, or Firm*—Pillsbury Winthrop LLP

(57) ABSTRACT

A flexible lustered product used in automobiles. The flexible lustered product includes a base material made of resin. A base coat layer is formed on at least a portion of a surface of the base material by applying a coating. The base coat layer has a glass transition point that is at least −30° C. and at most 0° C. The base coat layer includes a silane coupling agent having a mercapto group. A metal film layer is applied to at least a portion of a surface of the base coat layer. The metal film layer is anticorrosive and has a thickness that is at least 150 Å and at most 800 Å. The metal film layer is formed by a plurality of metal particles disposed in contact with one another so as to define a grain boundary between adjacent metal particles. A top coat layer is formed on at least a portion of a surface of the metal film layer by applying a coating.

19 Claims, 5 Drawing Sheets

FLEXIBLE LUSTERED PRODUCTS

BACKGROUND OF THE INVENTION

1. Field of Invention

The present invention relates to flexible lustered products used, for example, as automobile radiator grilles. More particularly, the present invention relates to flexible lustered products having a base material formed from flexible resin and a surface with metallic luster.

2. Brief Description of the Related Art

Figure 9:
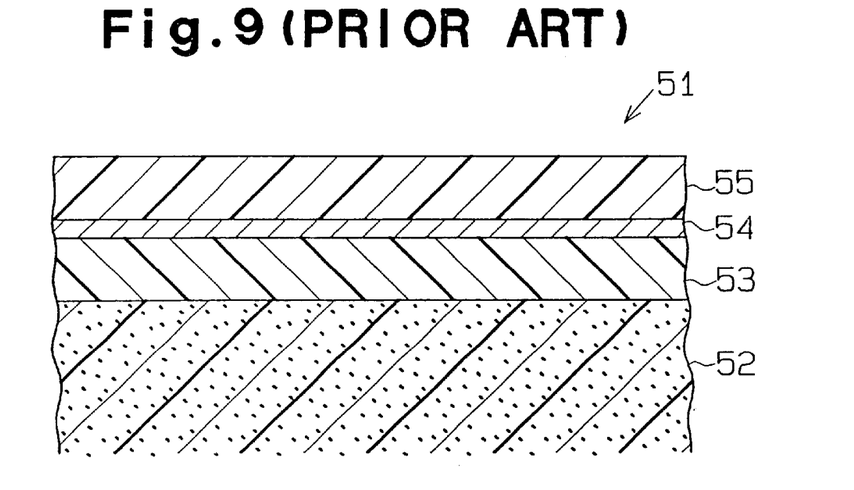
FIG. 9 is a cross-sectional view schematically showing the structure of a prior art flexible lustered product.

As shown in FIG. 9, a typical flexible lustered product 51 includes a base material 52, which is formed from a material such as polyurethane, a base coat layer 53, which is a coating applied to the base material 52, a metal film layer 54, which is applied to the base coat layer 53, and a top coat layer 55, which is applied to the metal film layer 54. The base coat layer 53 has a mirror smooth surface to enable satisfactory application of the film layer 54. The top coat layer 55 protects the film layer 54.

Figure 10:
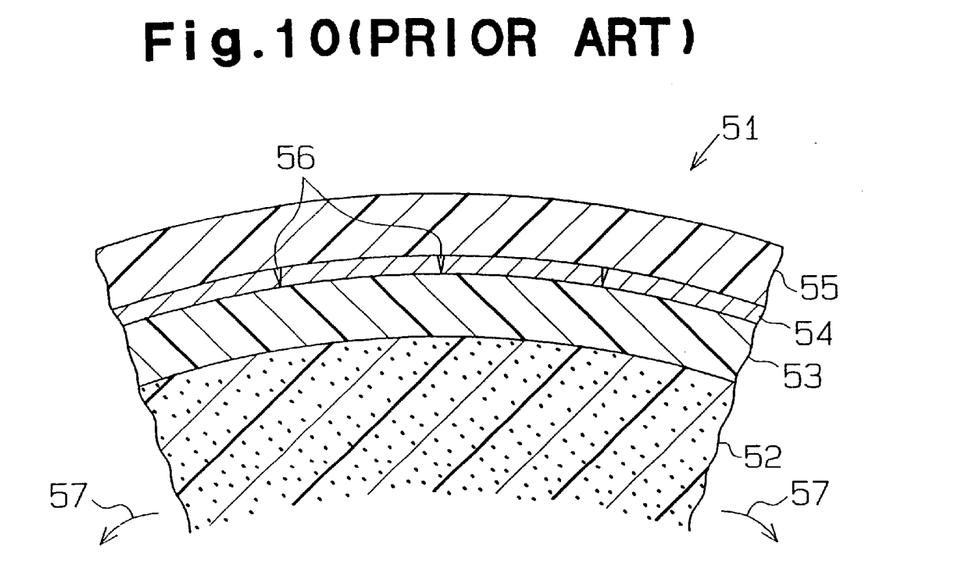
FIG. 10 is a cross-sectional view showing the deficiency of the prior art flexible lustered product.

The metal film layer 54 is formed from a continuous film that results in several problems. For example, the 25 application of an external force to the lustered product 51 may result in distortion or deformation of the product 51. Among the elements constituting the lustered product 51, the base material 52, the base coat layer 53, and the top coat layer 55 restore their original form after the application 30 of the external force. However, since the film layer 54 is made of a single sheet of metal film, it cannot tolerate as much deformation. As shown in FIG. 10, when the lustered product 51 is deformed by a large external force (arrow 57), the film layer 54 cannot follow the deformation of the base material 52 and the layers 53, 55. Thus, a relatively large stress acts on the film layer 54. This may form cracks 56 in the film layer 54. The cracks 56 appear as white streaks and thus deteriorate the appearance of the lustered product 51.

Japanese Unexamined Patent Publication No. 9-70920 describes a metal film layer that solves the above problems. The metal film layer is made of an anticorrosive metal and has a thickness that is at least 150 Å and at most 180 Å. The metal film layer also has grain boundaries.

When an external force acts on the flexible lustered product of Publication No. 9-70920, the base material, which is made of a flexible resin material, the base coat layer, and the top coat layer deform in accordance with the external force. The fine metal particles forming the metal film layer are visually perceived as a metal film having a uniform surface. However, due to the grain boundaries of the metal film layer, the application of an external force just moves adjacent crystal grains (metal grains) apart from each other and widens the distance between the crystal grains. This suppresses the formation of cracks and prevents deterioration of the appearance of the product. In addition, the anticorrosive property of the film layer prevents corrosion.

However, the metal film layer of the above publication 30 is still problematic in that the adhesion of the metal film layer to the base coat layer and the top coat layer is insufficient. This is because the base coat layer and the top coat layer are made of a resin material. Therefore, when the lustered product is used under harsh conditions or over a long period of time, the base coat layer and the top coat layer may peel off the metal film layer.

When a flexible lustered product is employed, for example, on the exterior of an automobile, paint is often applied to the top coat layer. In such case, the solvent included in the paint may cause swelling of the top coat layer. If the level of swelling becomes high, the adhesiveness between the metal film layer and the base coat layer becomes further insufficient. This may also result in the top coat layer peeling off the metal film layer.

SUMMARY OF THE INVENTION

Accordingly, it is an objective of the present invention to provide a flexible lustered product that prevents cracks from forming in its metal film layer, prevents deterioration of the quality of the outer appearance, and prevents peeling between its layers.

To achieve the above objective, the present invention provides a flexible lustered product including a base material made of resin. A base coat layer is formed on at least a portion of a surface of the base material by applying a coating. The base coat layer has a glass transition point that is at least −30° C. and at most 0° C. The base coat layer includes a silane coupling agent having a mercapto group. A metal film layer is applied to at least a portion of a surface of the base coat layer. The metal film layer is anticorrosive and has a thickness that is at least 150 Å and at most 800 Å. The metal film layer is formed by a plurality of metal particles disposed in contact with one another so as to define a grain boundary between adjacent metal particles. A top coat layer is formed on at least a portion of a surface of the metal film layer by applying a coating.

A further aspect of the present invention provides a flexible lustered product including a base material made of resin. A base coat layer is formed on at least a portion of a surface of the base material by applying a coating. A metal film layer is applied to at least a portion of a surface of the base coat layer. The metal film layer is anticorrosive and has a thickness that is at least 150 Å and at most 800 Å. The metal film layer is formed by a plurality of metal particles disposed in contact with one another to define a grain boundary between adjacent metal particles. A top coat layer is formed on at least a portion of a surface of the metal film layer by applying a coating. The top coat layer has a swelling rate of at least 100% and at most 150%. Furthermore, the top coat layer includes a silane coupling agent having a mercapto group.

Another aspect of the present invention provides a flexible lustered product including a base material made of resin. A base coat layer is formed on at least a portion of a surface of the base material by applying a coating. The base coat layer has a glass transition point that is at least −30° C. and at most 0° C. The base coat layer includes a silane coupling agent having a mercapto group. A metal film layer is applied to at least a portion of a surface of the base coat layer. The metal film layer is anticorrosive and has a thickness that is at least 150 Å and at most 800 Å. The metal film layer is formed by a plurality of metal particles disposed in contact with one another so as to define a grain boundary between adjacent metal particles. A top coat layer is formed on at least a portion of a surface of the metal film layer by applying a coating. The top coat layer has a swelling rate of at least 100% and at most 150%. The top coat layer also includes a silane coupling agent having a mercapto group.

Other aspects and advantages of the present invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

A first embodiment of a flexible lustered product according to the present invention will now be described with reference to FIGS. 1 to 5. The lustered product is employed in a radiator grille of an automobile.

Figure 1:
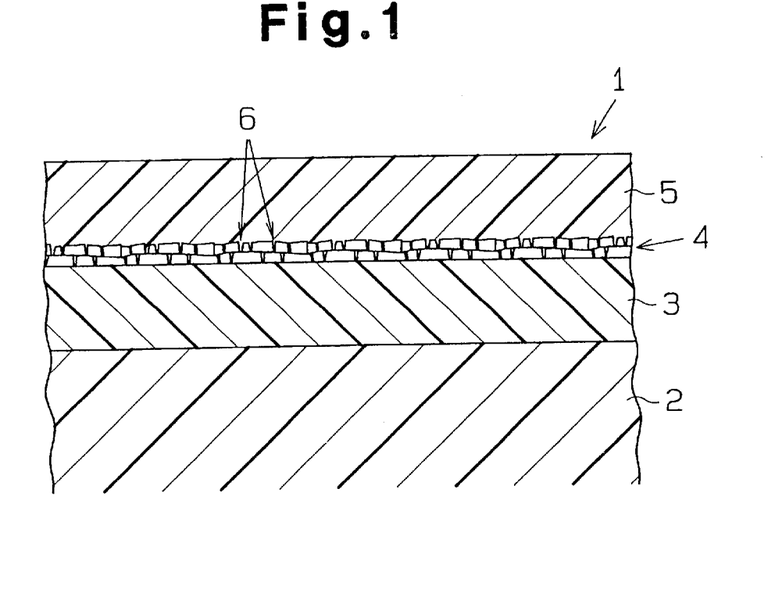
FIG. 1 is an enlarged cross-sectional view schematically showing a radiator grille according to a first embodiment of the present invention.
Figure 2:
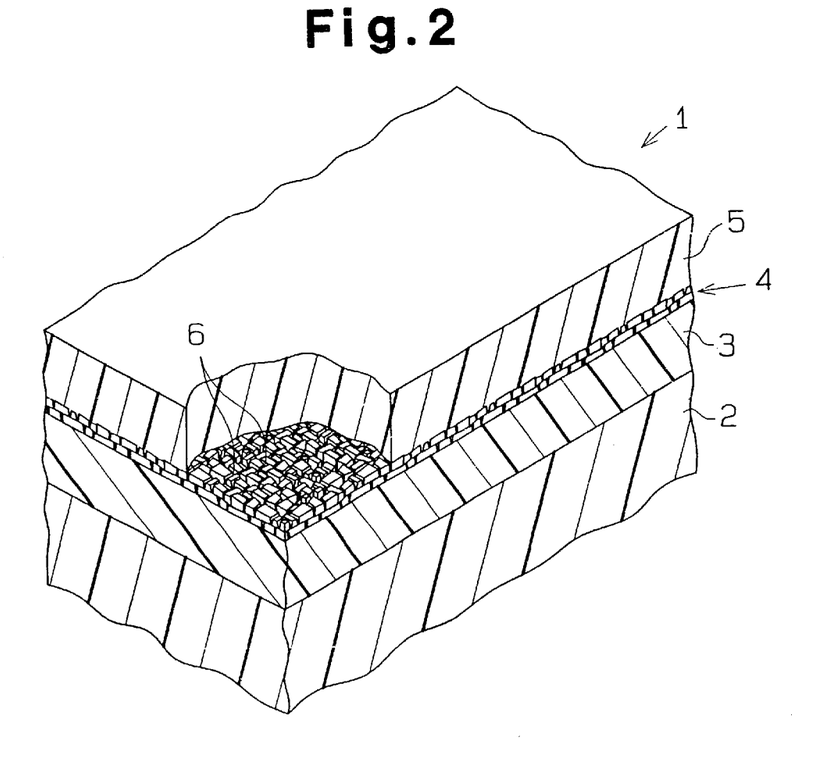
FIG. 2 is a partially cut-away perspective view schematically showing the radiator grille of FIG. 1.

As shown in FIGS. 1 and 2, a flexible lustered product, or radiator grille 1, has a base material 2, a base coat layer 3 applied to the base material 2, a metal film layer 4 applied to the base coat material 3, and a top coat layer 5 applied to the film layer 4. The base material 2 is molded, using a known molding method, from a polypropylene material admixed with a diene polymer, which includes rubber components and hydroxyl groups. Ethylene-propylene composition is preferably used as the rubber component. A product named FG5-1 and manufactured by Mitsubishi Kagaku Kabushiki Kaisha is preferably used as the polypropylene. The hydroxyl groups (OH groups) are used on the surface of the base material 2 as an adhesive component that enhances adhesion between the base material 2 and the base coat layer 3.

The preferred main component of the base coat layer 3 is a product named TG-B-2331, which is formed from a two liquid reaction acrylic urethane coating that includes a main agent and a hardening agent. The acrylic urethane coating is manufactured by Fujikura Kasei Kabushiki Kaisha. A one liquid lacquer coating may also be used for the base coat layer 3. The base coat layer 3 is formed by baking the coating at 110° C. for 90 minutes so that its thickness is about 25 μm. The preferred main component of the top coat layer 5 is a product named TG-T-2287, which is formed from a two liquid reaction acrylic urethane coating. that includes a main agent and a hardening agent. The acrylic urethane coating is manufactured by Fujikura Kasei Kabushiki Kaisha. A one liquid lacquer coating may also be used for the top coat layer 5. The top coat layer 5 is formed by baking the coating at 70° C. for 70 minutes so that it has a thickness of about 25 μm. The metal film layer 4 has a thickness of about 400 Å and is formed from an anticorrosive material, preferably from chromium having a purity of 99.99% and manufactured by Kojyundo Kagaku Kabushiki Kaisha. The thickness of the film layer 4 may be changed arbitrarily within a range of 150 Å to 800 Å. If the thickness of the film layer 4 is less than 150 Å, the metallic luster of the product may be lost. If the thickness of the film layer 4 is greater than 800 Å, the formation of crystal grain boundaries becomes difficult.

The film layer 4 is visually perceived as a metal film 4. However, a microscopic view of the film layer 4 reveals a composition structure formed by metal particles arranged continuously with adjacent particles in contact with each other. The boundary between each pair of adjacent metal particles defines a grain boundary 6.

The feature of the first embodiment of a flexible lustered product will be described. The base coat layer 3 has a glass transition point of −10° C. and is relatively soft. The base coat material 3 includes about 1.5% by weight of a silane coupling agent having a mercapto group (e.g., γ-mercaptopropyltrimethoxysilane and γ-mercaptopropylmethyldimethoxysilane). As the silane coupling agent, γ-mercaptopropyltrimethoxysilane is especially preferred.

Figure 3:
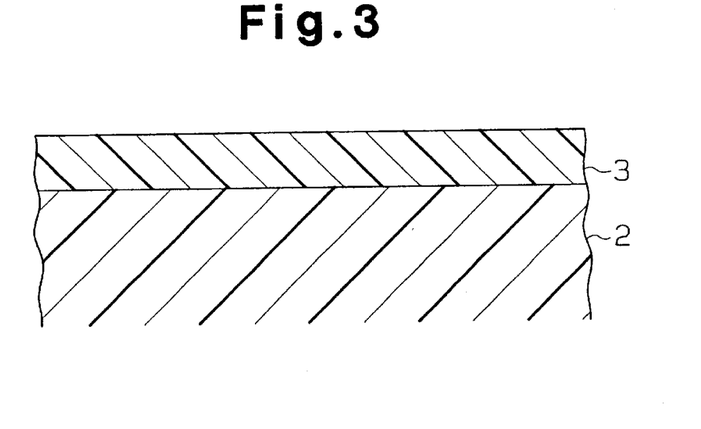
FIG. 3 is a cross-sectional view of the radiator grille taken during its production.
Figure 4:
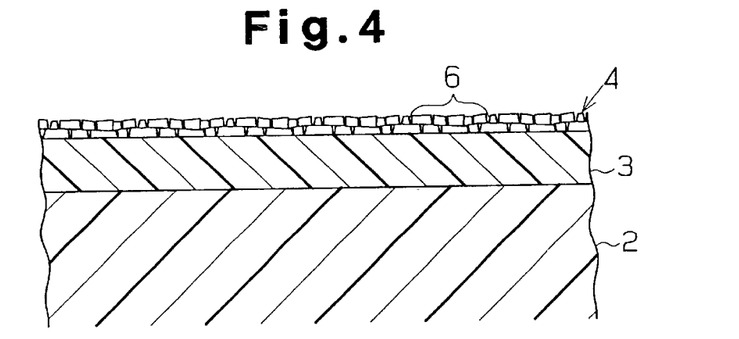
FIG. 4 is a cross-sectional view of the radiator grille taken during its production.

A method for producing the radiator grille 1 will now be described with reference to FIGS. 3 and 4. As shown in FIG. 3, the base material 2 having a shape similar to the radiator grille 1 is first molded by means of a known injection molding method. The surface of the base material 2 is degreased with isopropyl alcohol or the like and then air-dried. Afterward, a coating is applied to the surface of the base material 2 and then baked at a temperature of 110° C. for 90 minutes to form the base coat layer 3 so that its thickness is about 25 μm.

Subsequently, the base material 2, on which the base coat layer 3 is formed, is set in a known sputtering apparatus to undergo sputtering using chromium. During the sputtering, the initial vacuum degree is $6.0 \times 10^{-3}$ Pa, the film formation vacuum degree (argon gas pressure) is $1.0 \times 10^{-1}$ Pa or $5.0 \times 10^{-2}$ Pa. The voltage is set at 550V and the current is set at 80A during the sputtering. This forms the film layer 4 having the grain boundaries 6, as shown in FIG. 4. The average size of the crystal grains in the film layer 4 is 100 Å or smaller.

Afterward, a coating is applied to the film layer 4 and then baked at a high temperature of 70° C. for 70 minutes to form the top coat layer 5 with a thickness of about 25 μm, as shown in FIGS. 1 and 2. The product is then left to stand at room temperature for 24 hours to complete the formation of the radiator grille 1.

Figure 5:
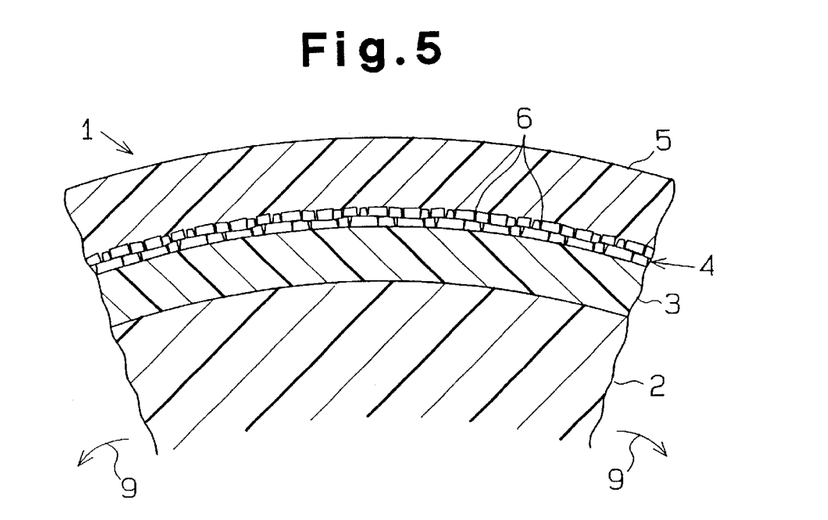
FIG. 5 is an enlarged cross-sectional view of the radiator grille when bent.

When an external force is applied to the above radiator grille 1, the flexible resin base material 2, the base coat layer 3, and the top coat layer 5 are deformed in accordance with the strength of the force, as shown in FIG. 5. Since the film layer 4 includes grain boundaries 6, the application of an external force only moves adjacent crystal grains (metal grains) apart from each other or only widens the distance between the crystal grains. Thus, stress does not negatively impact the metal particles forming the film layer 4. Accordingly, cracks are prevented from forming. This prevents deterioration in the outer appearance quality of the radiator grille 1.

The inventors of the present invention have conducted experiments to evaluate the above effects. The radiator grille 1 was bent ten times, each time by 90 degrees along a cylindrical rod having a diameter of 25 mm with the top coat layer 5 faced toward the outer side. The appearance of the radiator grille 1 was then visually evaluated. The radiator grille 1 was confirmed to have no deficiencies during the bending experiment.

A microscopic view of the film layer 4 reveals fine metal particles. However, the film layer 4, which is an aggregation of fine metal particles, is visually perceived 10 as a metal film having a uniform surface. In other words, the film layer 4 is viewed as an ordinary metal film by the naked eye. Accordingly, the radiator grille 1 has the same outer appearance quality as a film layer having a continuous metal particle structure. The film layer 4 was confirmed as having a visible light reflectance of 55%.

The film layer 4 is formed from chromium, which has an anticorrosive property, and is thus resistant to corrosion. Furthermore, the grain boundaries 6 of the film layer 4 results in low conductivity between adjacent crystal grains. Thus, if corrosion occurs at a portion of the film layer 4, the corrosion is prevented from spreading out. The film layer 4 has a surface resistance of 10 k$\Omega$/□.

Since the glass transition point of the base coat layer 3 is −10° C., the base coat layer 3 is relatively soft. Therefore, the crystal grains (metal particles) of the film layer 4 pierce and penetrate the base coat layer 3 in a relatively simple manner. This enhances the adhesion of the film layer 4 to the base coat layer 3. The glass transition point of the base coat layer 3 is high enough to obtain sufficient strength. Accordingly, the base coat layer 3 does not crack.

Furthermore, the base coat layer 3 includes a silane coupling agent having a mercapto group (γ-mercaptopropyltrimethoxysilane). This further enhances the adhesion between the base coat layer 3 and the film layer 4. Thus, the outer appearance quality of the radiator grille 1 is maintained and peeling between the base coat layer 3 and the film layer 4 is prevented.

The inventors of the present invention have conducted 10 the following experiment to confirm the above effects. In the experiment, sputtering was performed on base coat layers having different glass transition points $T_g$ to form the metal film layer 4. The appearance and adhesiveness of each film layer 4 and the associated base coat layer 3 were evaluated. The adhesiveness represents how simple it is for crystal grains to penetrate the base coat layer 3. The outer appearance quality is evaluated by confirming the occurrence of cracks after performing a simple bending experiment on the base coat layer 3 and the film layer 4. The results of the evaluations are shown in Table 1. The adhesiveness was evaluated by conducting a grid adhesiveness test according to that regulated by the Japanese Industrial Standard (JIS) D0202 4.15. This test is conducted by cutting the surface of a test piece into 100 grids. An adhesive tape is applied to the surface where the grids are formed and then quickly removed. Afterward, the peeling of the coating, that is, the adhesiveness between the base coat layer 3 and the film layer 4, is evaluated. In the table, a circle "○" indicates that peeling did not occur at any of 100 possible locations on the grid. A triangle "Δ" indicates that peeling occurred at less than five locations. An "X" indicates that peeling occurred at five or more locations. As for the outer appearance quality, a circle indicates that there were no cracks and an "X" indicates that cracks occurred.

TABLE 1

| Glass Transition Temperature $T_g$ (° C.) | 20 | 10 | 0 | −10 | −20 | −30 | −40 |
|---|---|---|---|---|---|---|---|
| Adhesiveness Peel Test Evaluation Result | x | x | Δ | ○ | ○ | ○ | ○ |
| Outer Appearance Quality (Cracks) | ○ | ○ | ○ | ○ | ○ | ○ | x |

As apparent from Table 1, the base coat layer 3 and the film layer 4 are strongly adhered to each other when the glass transition point $T_g$ of the base coat layer 3 is 0° C. or lower due to the softness of the base coat layer 3. On the other hand, peeling occurs between the base coat layer 3 and the film layer 4 when the glass transition point $T_g$ of the base coat layer 3 is 10° C. or higher.

However, if the glass transition point $T_g$ of the base coat layer 3 is too low (−40° C. or lower), the strength of the base coat layer 3 becomes insufficient and results in cracks. If the glass transition point $T_g$ is within a range of −30° C. or higher to 0° C. or lower, the adhesion between the base coat layer 3 and the film layer 4 is relatively strong.

The effectiveness of mixing a predetermined amount of silane coupling agent having a mercapto group (γ-mercaptopropyltrimethoxysilane) to the base coat layer 3 has also been confirmed. Base coat layers 3 containing 1.5% by weight of silane coupling agents having various types of functional groups were sputtered to form metal film layers 4 on the base coat layers 3. The adhesiveness between each base coat layer 3 and the associated film layer 4 were evaluated by conducting the grid adhesiveness test described above. The evaluation results are shown in Table 2. In the same manner, the adhesiveness between the base coat layer 3 and the film layer 4 when mixing a silane coupling agent having a mercapto group (γ-mercaptopropyltrimethoxysilane) to the base coat layer 3 at various content ratios has also been confirmed by conducting the grid adhesiveness test. The evaluation results are shown in Table 3.

TABLE 2

| Silane Coupling Agent | Compound Name | Result |
|---|---|---|
| Containing Amino Group | γ-(2-aminoethyl)aminopropyltri-methoxysilane | x |
| Containing Vinyl Group | vinyltrimethoxysilane | x |
| Containing Chloro Group | γ-chloropropyltrimethoxysilane | x |
| Containing Chloro Group Mercapto Group | γ-mercaptopropyltrimethoxysilane | ○ | x: not good
○: good

TABLE 3

| Content Ratio (% By Weight) | 0 | 0.8 | 1.5 | 2.0 | 3.0 |
|---|---|---|---|---|---|
| Adhesiveness Peel Test Result | x | ○ | ○ | ○ | x | x: not good
○: good

As apparent from Table 2, the base coat layer 3 and the film layer 4 are strongly adhered to each other when the base coat layer 3 contains a silane coupling agent having a mercapto group (γ-mercaptopropyltrimethoxysilane). When a silane coupling agent having a functional group other than the mercapto group (i.e., amino group, vinyl group, chloro group) is mixed with the base coat layer 3, the adhesion between the base coat layer 3 and the film layer 4 are not as strong as when using a silane agent having a mercapto group.

As apparent from Table 3, when the content ratio of the silane coupling agent having a mercapto group (γ-mercaptopropyltrimethoxysilane) is at least 0.8% by weight and at most 2.0% by weight, the base coat layer 3 and the film layer 4 are strongly adhered to each other. However, when the content ratio is not included in this range, the adhesion between the base coat layer 3 and the film layer 4 becomes weak.

The film layer 4 is formed by performing sputtering. Thus, a high level of kinetic energy is generated by the metal particles during formation of the film layer 4. This enhances the adhesion of the film layer 4 to the base coat layer 3. In addition, the relatively small size of the crystal grains in the film layer 4 permits more deformation of the film layer 4 and, thus, suppresses the formation of cracks.

A second embodiment according to the present invention will now be described. To avoid a redundant description, like or same numerals are given to those components which are the same as the corresponding components of the first embodiment.

Figure 6:
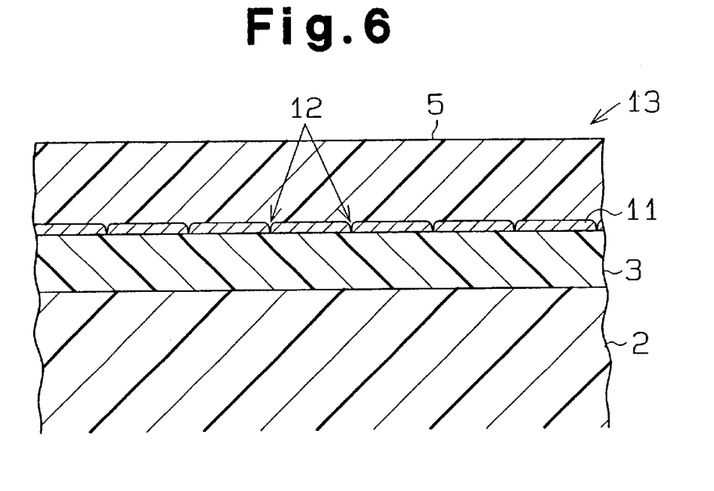
FIG. 6 is an enlarged cross-sectional view schematically showing a radiator grille according to a second embodiment of the present invention.
Figure 7:
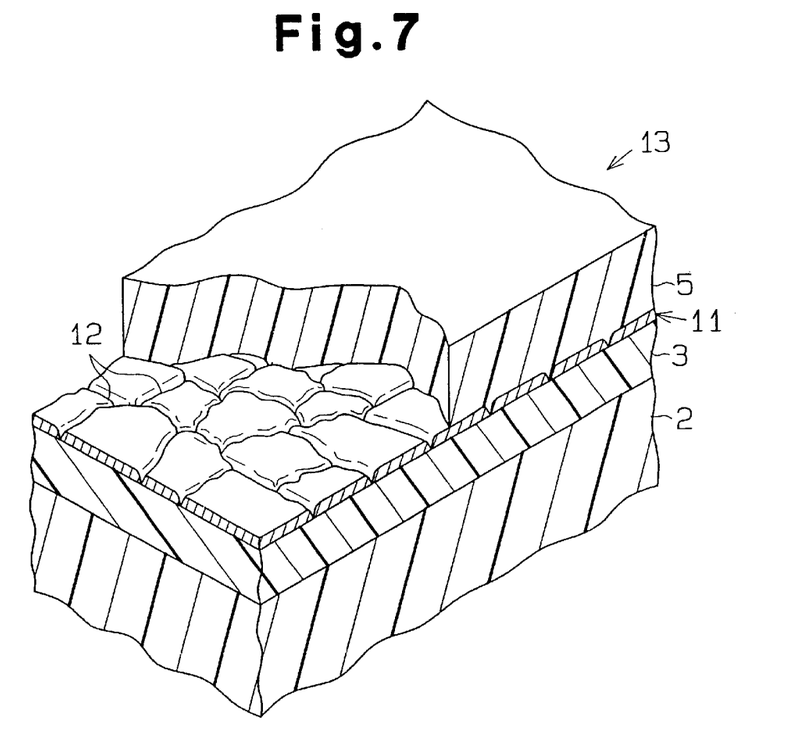
FIG. 7 is a partially cut-away perspective view schematically showing the radiator grille of FIG. 6.

As shown in FIGS. 6 and 7, the method for forming a metal film layer 11 differs from that of the first embodiment. Like the first embodiment, the film layer 11 is formed from chromium, has a thickness of about 400 Å, and is visually perceived as a metal film. However, a microscopic view of the film layer 11 reveals a composition structure formed by continuously arranged metal particles with adjacent particles in contacting one another. The boundary between each pair of adjacent metal particles defines a grain boundary 12.

In this embodiment, a radiator grille 13 having the above structure is preferably manufactured in the following manner. The base material 2 and the base coat layer 3 are formed in the same manner as the first embodiment. The base coat layer 3 and is baked for 90 minutes under a temperature of 110° C. The baking completes the formation of the base coat layer 3 so that the base coat layer 3 has a thickness of about 15 μm.

The base material 2 having the base coat layer 3 is then set in a known vacuum evaporator. Chromium vapor deposition is started when the initial vacuum degree reaches $2.0 \times 10^{-3}$ Pa. The rate of vacuum vapor deposition is preferably 1.0 Å/sec. This forms the film layer 11, which has grain boundaries 12, on the base coat layer 3. The average size of the crystal grains in the metal film layer 11 is 200 Å.

A urethane coating (the composition of which is the same as that of the first embodiment) is then applied to the film layer 11 to form the top coat layer 5. The top coat layer 5 is baked for 70 minutes under a temperature of 70° C. so that the top coat layer 5 has a thickness of about 20 μm. The baking completes the formation of the top coat layer 5 on the film layer 11 The product is then left to stand at room temperature for 24 hours and complete the formation of the radiator grille 13. The film layer 11 has a surface resistance of about 250 kΩ/□.

The same advantages as the first embodiment are obtained from the radiator grille 13 of the second embodiment.

A third embodiment according to the present invention will now be described. To avoid a redundant description, like or same numerals are given to those components which are the same as the corresponding components of the first embodiment.

Figure 8:
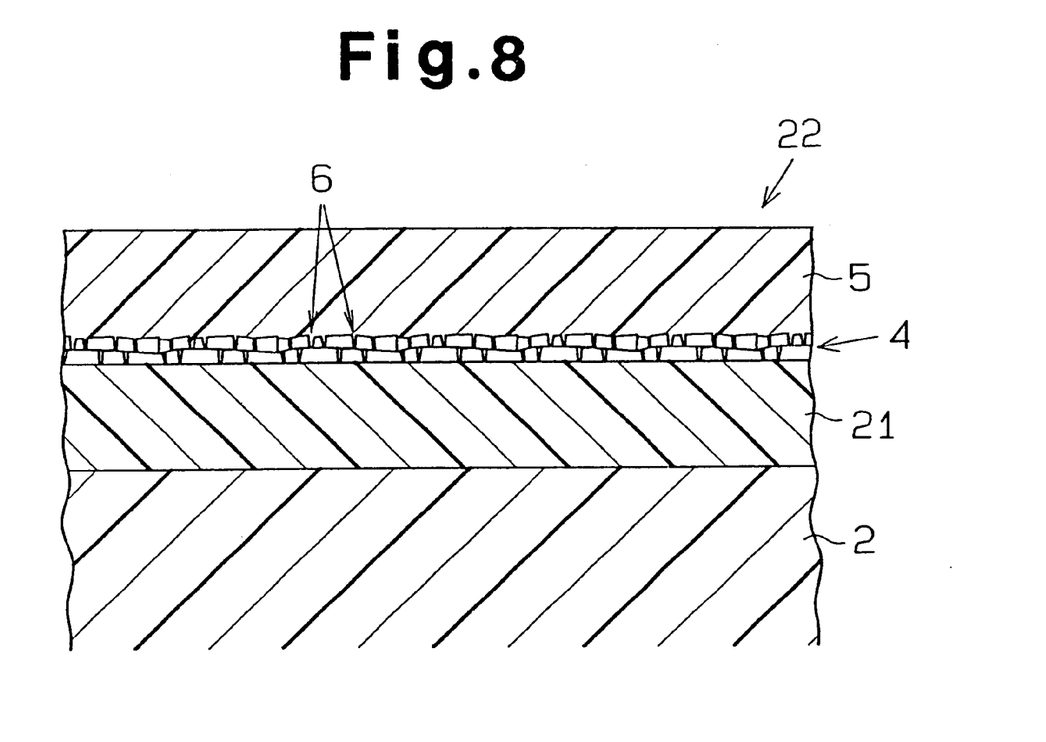
FIG. 8 is an enlarged cross-sectional view schematically showing a radiator grille according to a third embodiment of the present invention.

As shown in FIG. 8, the base coat layer 21 differs from that forming the base coat layer 3 of the first embodiment. In the first embodiment, the main component of the base coat layer 3 is an acrylic urethane. However, a radiator grille 22 of FIG. 8 has a base coat layer 21, the main component of which is polyesterpolyol having no less than three and no more than ten hydroxyl (OH) groups per molecule. If the number of hydroxyl groups per molecule is less than three, degradation in the adhesiveness of the metal film layer 4 with respect to the base coat layer 21 may take place. If the number of hydroxyl groups is more than ten per molecule, the smoothness of the metal film layer 4 may be degraded. It is preferred that the number of hydroxyl groups per molecule be no less than four and no more than nine. It is further preferred that the number of hydroxyl groups per molecule be no less than six and no more than eight.

The main component of the base coat layer 21 may be a hard coating component such as alkyd resin or acrylic resin. A soft coating component such as polyester and polyether may also be used as the main component of the base coat layer 21. These hard and soft coating components may be used independently or may be used in combination with one another as long as the number of hydroxyl groups per molecule used as the coating component of the base coat layer 21 is no less than three and no more than ten. However, in this embodiment, the coating used to form the base coat layer 21 includes isocyanate, the number of molecules of which is the same as that of polyesterpolyol.

In the embodiment of FIG. 8, the base coat layer 21 includes polyesterpolyol, the number of hydroxyl groups per molecule of which is no less than three and no more than ten, and isocyanate. The hydroxyl groups of polyesterpolyol react with isocyanate and produce polyurethane having urethane bonds. Since polyesterpolyol and isocyanate have the same number of molecules, at least one hydroxyl groups and at most eight hydroxyl groups remain per molecule in the coating even if two hydroxyl groups per molecule of polyesterpolyol are used by an urethane bond. The residual hydroxyl groups cause the coating to have polarity. When the metal film layer 4 is formed on the surface of the base coat layer 21 by a sputtering device, the polarity of the base coat layer 21 enhances the adhesion of the film layer 4 to the surface of the base coat layer 21. In other words, the polarity of the base coat layer 21 improves the adhesiveness of the film layer 4 to the base coat layer 21.

Accordingly, the advantages of the first embodiment are obtained by the radiator grille 22 of this embodiment.

An experiment was conducted to confirm the advantages of this embodiment. To perform the experiment, polyesterpolyol having 2, 3, 4, 6, 8, 9, 10, and 12 hydroxyl groups per molecule and isocyanate having the same number of molecules as polyesterpolyol were prepared to form respective base coat layers. A metal film coat layer was formed on each base coat layer by sputtering. The adhesiveness of each metal film layer with respect to the associated base coat layer and the smoothness of each metal film layer were evaluated by conducting the grid adhesiveness test. The evaluation results are shown in Table 4. In the Table, a circle "○" indicates that peeling was not confirmed at any of 100 possible locations on the grid. A triangle indicates that peeling was confirmed at less than five locations. An "X" indicates that peeling was confirmed at five or more locations. As for the smoothness, a circle indicates satisfactory smoothness, a triangle "Δ" indicates that the smoothness was rather unsatisfactory though sufficient for usage, and an "×" indicates that the smoothness is insufficient for usage.

TABLE 4

| Number of Hydroxyl Groups | 2 | 3 | 4 | 6 | 8 | 9 | 10 | 12 |
|---|---|---|---|---|---|---|---|---|
| Adhesiveness Peel Test Evaluation Result | x | Δ | ○ | ○ | ○ | ○ | ○ | ○ |
| Smoothness of Base Material | ○ | ○ | ○ | ○ | ○ | ○ | Δ | x | x: not good
Δ: good
○: very good

As apparent from Table 4, high adhesion is maintained between the base coat layer and the film layer when the base coat layer contains three or more hydroxyl groups per molecule. When the number of hydroxyl groups per molecule is less than three, the adhesion between the base coat layer and the film layer becomes weak. It is believed that these results are due to the absence of hydroxyl groups in the coating. Since the polyesterpolyol hydroxyl groups are used by the urethane bonds, polarity is not produced in the coating and the base coat layer.

It is also apparent that there is no problem in the smoothness of the metal film layer when there are two or more and nine or less hydroxyl groups per molecule. If there are ten hydroxyl groups per molecule, the smoothness of the metal film layer may be unsatisfactory but this should not interfere with usage. Furthermore, if there are twelve hydroxyl groups per molecule, the smoothness of the metal film layer is degraded and the metal film layer thus cannot be used. It is believed that an increase in surplus hydroxyl groups in the coating increases the influence of the hydroxyl groups on the smoothness of the base coat layer. Thus, when there are three or more and ten or less hydroxyl groups per molecule, the adhesion between the base coat layer and the metal film layer and the smoothness of the metal film layer is maintained at a relatively high level.

A further experiment was conducted to confirm the adhesion between the base coat layer 21 and the metal film layer 4. In the experiment, a test piece was formed in the same manner as the test piece used to evaluate the adhesiveness and the smoothness of the metal film layer. A weather resistance test was then performed on the test piece using a Super UV Tester. Subsequently, the grid adhesiveness test was conducted to evaluate the adhesion of the metal film layer to the base coat layer. The evaluation results are shown in Table 5.

In the Table, x/16 indicates the number of grids that were peeled among the 16 grids (where x is an integer). A circle indicates that peeling did not occur at any of 16 possible locations on the grid. A triangle indicates that peeling occurred at less than five locations. An "×" indicates that peeling occurred at five or more locations.

In sample No. 1, there were two polyesterpolyol hydroxyl groups per molecule. In sample No. 2, there were three polyesterpolyol hydroxyl groups per molecule. In sample No. 3, there were four, six, eight, nine, and ten polyesterpolyol hydroxyl groups per molecule. Since the test pieces with four, six, eight, nine, and ten polyesterpolyol hydroxyl groups per molecule had the same results, each of these polyesterpolyol hydroxyl groups are represented by sample No. 3 in the table.

TABLE 5

| No. | Number of Hydroxyl Group | Number of Super UV Processing Cycles | | | | | |
|---|---|---|---|---|---|---|---|
| | | 15 | 20 | 25 | 30 | 35 | 40 |
| 1 | 2 | 0/16 ○ | 7/16 x | | | | |
| 2 | 3 | 0/16 ○ | 0/16 ○ | 3/16 Δ | | | |
| 3 | 4, 6, 8, 9, 10 | 0/16 ○ | 0/16 ○ | 0/16 ○ | 0/16 ○ | 0/16 ○ | 0/16 ○ |

As apparent from Table 5, peeling occurred on the test piece having two hydroxyl groups per molecule (sample No. 1) after 20 cycles of the super UV processing. Peeling occurred on the test piece having two hydroxyl groups per molecule (sample No. 2) after 25 cycles of the super UV processing. However, the adhesion between the base coat layer and the metal film layer was better in comparison with sample No. 1. Peeling did not occur on the test pieces having 3, 4, 6, 8, 9, 10 hydroxyl groups per molecule (sample No. 3) even after 40 cycles of the super UV processing. Therefore, high adhesion is maintained between the base coat layer and the film layer when the base coat layer contains 3 to 10 hydroxyl groups per molecule.

A fourth embodiment according to the present invention will now be described. The flexible lustered product of this embodiment has the same shape as that of the first embodiment and is produced using the same method.

In this embodiment, the silane coupling agent having a mercapto group (e.g., γ-mercaptopropyltrimethoxysilane and γ-mercaptopropylmethyldimethoxysilane) is admixed with the top coat layer 5 instead of the base coat layer 3. The content ratio of the silane coupling agent is 2.5% by weight. The especially preferred silane coupling agent having a mercapto group is γ-mercaptopropyltrimethoxysilane. The top coat layer 5 further contains 9% by weight of a high ultraviolet ray absorbent (at least either one of a benzotriazole ultraviolet ray absorbent or a benzophenone ultraviolet ray absorbent). As long as the ultraviolet absorbing property is superior, other high ultraviolet ray absorbents such as a salicylic acid ultraviolet ray absorbent or a cyanoacrylate ultraviolet ray absorbent may also be used.

The top coat layer 5 has a swelling rate (the volume swelling rate of the top coat layer 5 during permeation of an organic solvent) of 130% and a high crosslinking density. To provide a top coat layer 5 having a high crosslinking density, the top coat layer 5 is admixed with acrylic polyol, which serves as a main agent, and hexadimethyleneisocyanate (HDI), which serves as a hardening agent.

The high crosslinking density of the top coat layer 5 suppresses swelling of the top coat layer 5 even when the solvent in the coating applied to the top coat layer 5 permeates the coat layer 5. Therefore, the adhesion between the film layer 4 and the top coat layer 5 is maintained. Accordingly, peeling does not occur between the film layer 4 and the top coat layer 5.

The inventors of the present invention have conducted the following experiment to confirm the above effects.

Various top coat layers 5 having different coatings were formed. Each top coat layer 5 was immersed in a solvent (chloroform) for ten minutes at room temperature and then dried. As a result, top coat layers 5 having different swelling rates (100%, 110%, 120%, 130%, 140%, 150%, 160%) were formed. Sputtering was performed on the base coat layer 3 applied to the base material to form the film layer 4. Top coat layers 5 having different swelling rates were then applied to the film layer 4. After applying a paint to each top coat layer 5, the adhesion between the film layer 4 and each top coat layer 5 was evaluated as described below. The evaluation results are shown in Table 6. In the Table, a circle "○" indicates that peeling did not occur at all.

An "×" indicates that peeling, no matter how little, took place.

After applying paint to each top coat layer 5, two straight slits were cut into the top coat layer 5 extending to the base material. The slits, which were formed intersecting each other at an angle of about 30 degrees, were used to evaluate the peeling of the top coat layer 5. An adhesive tape was applied to the top coat layer 5 at the portion including the slits and then removed quickly. The adhesion between the film layer 4 and the top coat layer 5 was evaluated by confirming whether peeling of the top coat layer 5 occurred when removing the tape.

TABLE 6

| Swelling Rate (%) | 100 | 110 | 120 | 130 | 140 | 150 | 160 |
|---|---|---|---|---|---|---|---|
| Adhesiveness Feel Test Evaluation Result | ○ | ○ | ○ | ○ | ○ | ○ | × | x: not good
o: good

As apparent from Table 6, strong adhesion is maintained if the swelling rate of the top coat layer 5 is at least 100% and at most 150% even if the solvent permeates the top coat layer 5. Peeling between the film layer 4 and the top coat layer 5 occurs when the swelling rate of the top coat layer 5 exceeds 150%.

In this embodiment, a silane coupling agent having a mercapto group (γ-mercaptopropyltrimethoxysilane) is used. Thus, the silane coupling agent bonds the film layer 4 and the top coat layer 5 to each other and enhances the adhesion therebetween. This suppresses peeling between the film layer 4 and the top coat layer 5.

The inventors of the present invention have also conducted experiments to confirm the effectiveness of mixing a predetermined amount of a silane coupling agent having a mercapto group (γ-mercaptopropyltrimethoxysilane) to the top coat layer 5. Sputtering was performed on the base coat layer 3 applied to the base material to form the film layer 4. A top coat layer 5 was then formed by mixing 2.5% by weight of various silane coupling agents, each having different functional groups, to produce samples. The grid adhesiveness test described in the description of the first embodiment was then carried out on the samples to evaluate the adhesion between the film layer 4 and the top coat layer 5. The evaluation results were the same as that obtained when admixing a silane coupling agent with the base coat layer 3 (refer to Table 2). That is, the silane coupling agent having a mercapto group (γ-mercaptopropyltrimethoxysilane) guarantees a high level of adhesion between the film layer 4 and the top coat layer 5.

Furthermore, in this embodiment, 2.5% by weight of the silane coupling agent having a mercapto group (γ-mercaptopropyltrimethoxysilane) is admixed with the top coat layer 5. Therefore, in the same manner as the base coat layer 3, the adhesion between the top coat layer 5 and the film layer 4 is improved. This embodiment therefore suppresses peeling between the top coat layer 5 and the film layer 4.

The adhesion between the top coat layer 5 and the film layer 4 when mixing silane coupling agents of various content ratios has also been confirmed by conducting the grid adhesiveness test. The evaluation results are shown in Table 7.

TABLE 7

| Content Ratio (% By Weight) | 0 | 1.2 | 2.2 | 3.2 | 4.5 |
|---|---|---|---|---|---|
| Adhesiveness Peel Test Evaluation Result | × | ○ | ○ | ○ | × | x: not good
o: good

As shown in Table 7, when the content ratio of the silane coupling agent having a mercapto group (γ-mercaptopropyltrimethoxysilane) is at least 1.2% by weight and at most 3.2% by weight, the top coat layer 5 and the film layer 4 are strongly adhered to each other. When the content ratio is not included in this range, the adhesion between the top coat layer 5 and the film layer 4 becomes weak.

Additionally, the top coat layer 5 includes a high ultraviolet ray absorbent. This suppresses the amount of ultraviolet rays that permeate the top coat layer 5. Accordingly, the adhesion between the top coat layer 5 and the film layer 4 remains unchanged despite the usage of the radiator grille 1 over a long period of time. Thus, the ultraviolet ray absorbent further suppresses peeling between the film layer and the top coat layer 5.

The inventors of the present invention have conducted experiments to confirm how the admixture of the high ultraviolet ray absorbent effects the top coat layer 5. The adhesion and appearance quality of the top coat layer 5 and the film layer 4 were evaluated by varying the content ratio of the ultraviolet absorbent. The evaluations were made by conducting the grid adhesiveness test after exposing the samples to ultraviolet rays for a predetermined period of time. The evaluations results are shown in Table 8.

TABLE 8

| Content Ratio (% By Weight) | 0 | 3 | 6 | 9 | 12 |
|---|---|---|---|---|---|
| Peel Test Evaluation Result | × | × | Δ | ○ | ○ |
| Outer Appearance (Color) | ○ | ○ | ○ | ○ | × | x: not good
Δ: good
o: very good

As apparent from Table 8, the ultraviolet ray absorbent improves the weather resistance of the film layer 4 and the top coat layer 5. High adhesion is maintained between the top coat layer 5 and the film layer 4 especially when the top coat layer 5 contains 6% by weight or more of the ultraviolet ray absorbent.

If the content ratio of the high ultraviolet ray absorbent is too high, that is, if the content ratio is 12% by weight or more, the adhesion between the top coat layer 5 and the film layer 4 is maintained but the top coat layer 5 yellows and thus affects the outer appearance quality.

Accordingly, it is preferable that the content ratio of the ultraviolet ray absorbent be 6% by weight or more and lower than 12% by weight.

In the radiator grille 1 of the embodiment shown in FIGS. 6 and 7, a radical trap agent may be contained in the top coat layer 5. In this case, the radiator grille 1 is manufactured using the same method as the second embodiment.

The silane coupling agent may be contained in the base coat layer 3 and also the top coat layer 5 regardless of the composition of the base of the radiator grille 1. This enhances the adhesion between the base coat layer 3 and the film layers 4, 11 and between the film layers 4, 11 and the top coat layer 5.

It should be apparent to those skilled in the art that the present invention may be embodied in many other specific forms without departing from the spirit or scope of the invention.

In the above embodiments, the metal film layers 4 and 11 may be formed from an anticorrosive metal material other than chromium such as nickel, titanium, tantalum, aluminum, or an alloy of these metals.

The grain boundaries 6 and 12 of the associated film layers 4, 11, respectively, were formed by performing sputtering or vacuum deposition in the above embodiments. However, other methods such as ion plating may be performed instead to form grain boundaries.

In the above embodiments, the flexible lustered products are applied to automobile radiator grilles 1, 13, 22. However, the flexible lustered products may also be applied to other components used in the interior or exterior of automobiles, such as emblems or mouldings.

The color of the lustered product elements including the base material 2 were not specified above. However, it is obvious that the elements may be colored.

Therefore, the present examples and embodiments are to be considered as illustrative and not restrictive and the invention is not to be limited to the details given herein, but may be modified within the scope and equivalence of the appended claims.

What is claimed is:

1. A flexible lustered product comprising:
  a base material made of a resin;
  a base coat layer formed on at least a portion of a surface of the base material, wherein the base coat layer has a glass transition point that is at least about −30° C. and at most about 0° C., wherein the base coat layer includes a silane coupling agent having a mercapto group, wherein the base coat layer further includes a urethane compound that has at least one and at most eight residual hydroxyl moieties per molecule, and wherein said urethane compound is formed by a reaction between a polyesterpolyol having between three and ten hydroxyl moieties per molecule prior to reaction and a diisocyanate, wherein the polyesterpolyol and the diisocyanate are present in the same molar concentration;
  a metal film layer applied to at least a portion of a surface of the base coat layer, wherein the metal film layer is anticorrosive and has a thickness that is at least 150 Å and at most 800 Å, and wherein the metal film layer is formed by a plurality of metal particles disposed in contact with one another so as to define a grain boundary between adjacent metal particles; and
  a top coat layer formed on at least a portion of a surface of the metal film layer.

2. The lustered product of claim 1, wherein the silane coupling agent in the base coat layer ranges from about 0.8% by weight to about 2.0% by weight.

3. The lustered product of claim 1, wherein the silane coupling agent in the base coat layer is γ-mercaptopropyltrimethoxysilane.

4. The lustered product of claim 1, wherein the base coat layer has a glass transition point that is substantially −10° C. and includes substantially 1.5% by weight of the silane coupling agent.

5. A flexible lustered product comprising:
  a base material made of a resin;
  a base coat layer formed on at least a portion of a surface of the base material, wherein the base coat layer has a glass transition point that is at least about −30° C. and at most about 0° C., wherein the base coat layer further includes a urethane compound that has at least one and at most eight residual hydroxyl moieties per molecule, and wherein said urethane compound is formed by a reaction between a polyesterpolyol having between three and ten hydroxyl moieties per molecule prior to reaction and a diisocyanate, wherein the polyesterpolyol and the diisocyanate are present in the same molar concentration;
  a metal film layer applied to at least a portion of a surface of the base coat layer, wherein the metal film layer is anticorrosive and has a thickness that is at least 150 Å and at most 800 Å, and wherein the metal film layer is formed by a plurality of metal particles disposed in contact with one another to define a grain boundary between adjacent metal particles; and
  a top coat layer formed on at least a portion of a surface of the metal film layer, wherein the top coat layer has a swelling rate of at least 100% and at most 150% when the top coat layer is swelled by chloroform, and wherein the top coat layer includes a silane coupling agent having a mercapto group.

6. The lustered product of claim 5, wherein the top coat layer includes an ultraviolet ray absorbent.

7. The lustered product of claim 6, wherein the ultraviolet ray absorbent ranges from 6% by weight to 12% by weight of the top coat layer.

8. The lustered product of claim 6, wherein the ultraviolet ray absorbent includes at least either one of a benzotriazole ultraviolet ray absorbent and a benzophenone ultraviolet ray absorbent.

9. The lustered product of claim 5, wherein the silane coupling agent ranges from 1.2% by weight to 3.2% by weight of the top coat layer.

10. The lustered product of claim 5, wherein the silane coupling agent in the top coat layer is γ-mercaptopropyltrimethoxysilane.

11. The lustered product of claim 5, wherein the top coat layer includes acrylic polyol, which serves as a main agent, and hexadimethyleneisocyanate, which serves as a hardening agent.

12. A flexible lustered product comprising:
  a base material made of a resin;
  a base coat layer formed on at least a portion of a surface of the base material, wherein the base coat layer has a glass transition point that is at least −30° C. and at most 0° C., wherein the base coat layer includes a silane coupling agent having a mercapto group, wherein the base coat layer further includes a urethane compound that has at least one and at most eight residual hydroxyl moieties per molecule, and wherein said urethane compound is formed by a reaction between a polyesterpolyol having between three and ten hydroxyl moieties per molecule prior to reaction and a diisocyanate, wherein the polyesterpolyol and the diisocyanate are present in the same molar concentration;

a metal film layer applied to at least a portion of a surface of the base coat layer, wherein the metal film layer is anticorrosive and has a thickness that is at least 150 Å and at most 800 Å, and wherein the metal film layer is formed by a plurality of metal particles disposed in contact with one another so as to define a grain boundary between adjacent metal particles; and a top coat layer formed on at least a portion of a surface of the metal film layer, wherein the top coat layer has a swelling rate of at least 100% and at most 150% when the top coat layer is swelled by chloroform, and wherein the top coat layer includes a silane coupling agent having a mercapto group.

13. The lustered product of claim 12, wherein the silane coupling agent ranges from 0.8% by weight to 2.0% by weight of the top coat layer.

14. The lustered product of claim 12, wherein the silane coupling agent in the top coat layer is γ-mercaptopropyltrimethoxysilane.

15. The lustered product of claim 12, wherein the top coat layer includes an ultraviolet ray absorbent.

16. The lustered product of claim 15, wherein the ultraviolet ray absorbent ranges from 6% by weight to 12% by weight of the top coat layer.

17. The lustered product of claim 15, wherein the ultraviolet ray absorbent includes at least either one of a benzotriazole ultraviolet ray absorbent and a benzophenone ultraviolet ray absorbent.

18. The lustered product of claim 12, wherein the silane coupling agent ranges from 1.2% by weight to 3.2% by weight of the top coat layer.

19. The lustered product of claim 12, wherein the coating for forming the top coat layer includes acrylic polyol, which serves as a main agent, and hexadimethyleneisocyanate, which serves as a hardening agent.

* * * * *

UNITED STATES PATENT AND TRADEMARK OFFICE
CERTIFICATE OF CORRECTION

PATENT NO. : 6,410,131 B1
APPLICATION NO. : 09/080291
DATED : June 25, 2002
INVENTOR(S) : Kawazu et al.

It is certified that error appears in the above-identified patent and that said Letters Patent is hereby corrected as shown below:

ON THE FACE OF THE PATENT:

Please change "[73] Assignee:    Toyoda Gosei Co., Ltd., Aichi-ken, Japan; Toyoda Jidosha Kabushiki Kaisha, Tokyo, Japan;"
To --[73] Assignee:    Toyoda Gosei Co., Ltd., Aichi-ken, Japan Toyota Jidosha Kabushiki Kaisha, Toyota-shi, Japan--

Signed and Sealed this

Twenty-eighth Day of November, 2006

JON W. DUDAS
*Director of the United States Patent and Trademark Office*